United States Patent
Lu et al.

(10) Patent No.: US 9,182,659 B2
(45) Date of Patent: Nov. 10, 2015

(54) EXTREME ULTRAVIOLET LITHOGRAPHY PROCESS AND MASK

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsinchu (TW); Jeng-Horng Chen, Hsin-Chu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 172 days.

(21) Appl. No.: 14/020,302

(22) Filed: Sep. 6, 2013

(65) Prior Publication Data
US 2015/0072271 A1    Mar. 12, 2015

(51) Int. Cl.
*G03F 1/22* (2012.01)
*G03F 1/24* (2012.01)
*G03F 7/20* (2006.01)
*G03F 1/48* (2012.01)

(52) U.S. Cl.
CPC .. *G03F 1/24* (2013.01); *G03F 1/48* (2013.01); *G03F 7/2002* (2013.01); *G03F 7/2022* (2013.01)

(58) Field of Classification Search
CPC ............ G03F 1/22; G03F 1/24; G03F 7/2022
USPC ............................................... 430/5, 322, 394
See application file for complete search history.

(56) References Cited

U.S. PATENT DOCUMENTS 6,627,358 B1 *  9/2003  Lin .................................. 430/5

OTHER PUBLICATIONS

Lorusso, G.F., et al, "Metrology development for extreme ultraviolet lithography: Flare and out-of-band qualification," Journal of Vacuum Science & Technology B: Microelectroincs and Nanometer Structures (vol. 29, Issue 6). Nov. 2011, pp. 06F505-06F505-7.

* cited by examiner

*Primary Examiner* — Stephen Rosasco
(74) *Attorney, Agent, or Firm* — Haynes and Boone, LLP (57) ABSTRACT

A system and process of an extreme ultraviolet lithography (EUVL) is disclosed. An EUVL process includes receiving a mask pair having a same pattern. The mask pair includes an extreme ultraviolet (EUV) mask and a low EUV reflectivity mask. A first exposure process is performed by using the EUV mask to expose a substrate. A second exposure process is performed by using the low EUV reflectivity mask to expose the same substrate. The first exposure process is conducted according to a first exposure dose matrix and the second exposure process is conducted according to a second exposure dose matrix.

20 Claims, 7 Drawing Sheets

EXTREME ULTRAVIOLET LITHOGRAPHY PROCESS AND MASK

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As the size of a device feature, such as gate length, has decreased, numerous challenges have risen. High resolution lithography processes are often one of the more important areas to decreasing feature size, and improvements in this area are generally desired. One lithography technique is extreme ultraviolet (EUV) lithography. Other techniques include X-Ray lithography, ion beam projection lithography, electron beam projection lithography, and multiple electron beam maskless lithography.

EUV lithography is a promising patterning technology for semiconductor technology nodes with very small feature sizes, such as 14-nm, and beyond. EUV lithography is very similar to optical lithography in that it uses a mask to print wafers. However, unlike optical lithography, EUV employs light in the EUV region, e.g., at about 13.5 nm. At the wavelength of 13.5 nm, most materials are highly absorbing. Thus, reflective optics, rather than refractive optics, are commonly used in EUV lithography. Although existing methods of EUV lithography have been generally adequate for their intended purposes, they have not been entirely satisfactory in all respects. For example, the EUV light produced by tin plasma, such as DPP (discharge-produced plasma) and LPP (laser-produced plasma), emits some out of band (OOB) radiation. A portion of the OOB radiation (sometimes referred to as a flare) can also arrive at the target substrate (e.g., a wafer) and cause image contrast loss. So it is desired to have further improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and dose not in itself dictate a relationship between the various embodiments and/or configurations discussed.

Further, spatially relative terms, such as "beneath", "below", "lower", "above", "upper", "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
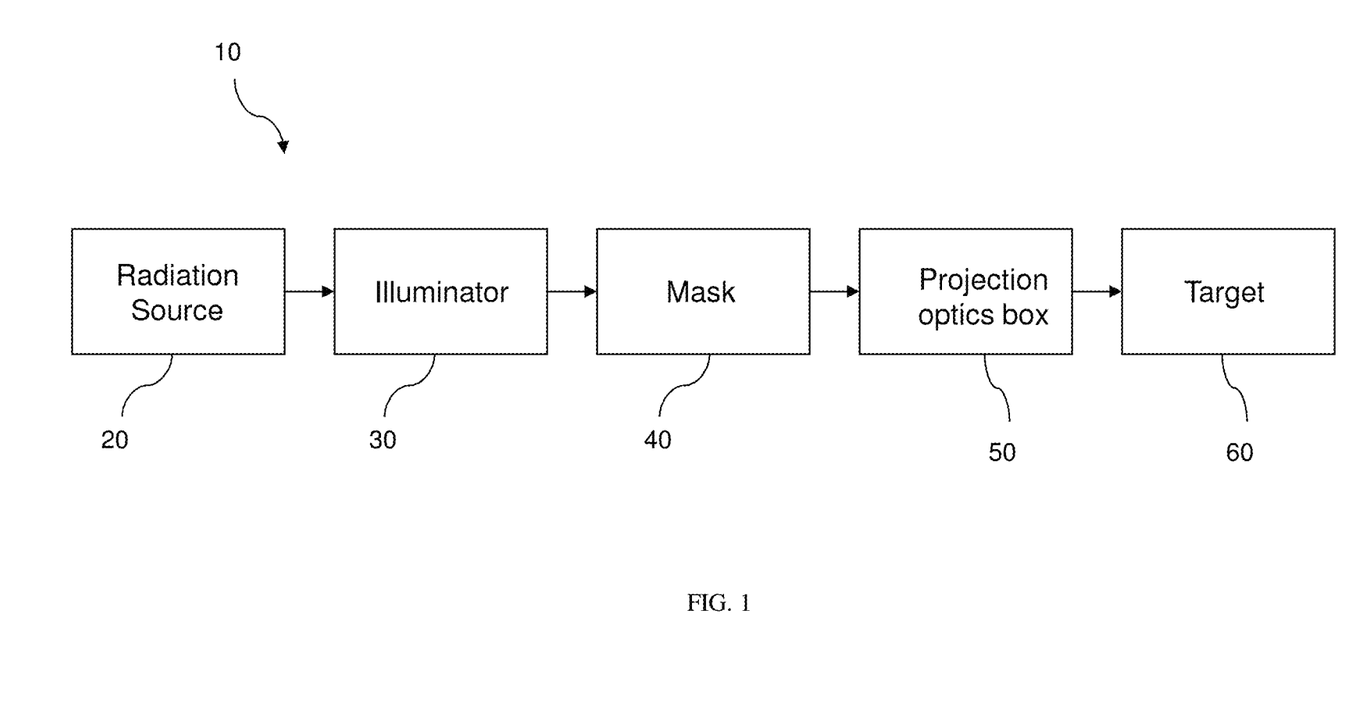
FIG. 1 is a block diagram of a lithography process for implementing one or more embodiments of the present disclosure.

Referring to FIG. 1, an EUV lithography process 10 that may benefit from one or more embodiments of the present invention is disclosed. The EUV lithography process 10 employs an EUV radiation source 20, including an EUV wavelength of about 13.5 nm.

The EUV lithography process 10 also employs an illuminator 30. The illuminator 30 may comprise reflective optics, such as a single mirror or a mirror system having multiple mirrors in order to direct light from the radiation source 20 onto a mask 40. In the EUV wavelength range, reflective optics is employed generally. Refractive optics, however, can also be realized by zoneplates.

The EUV lithography process 10 also employs a mask 40 (the terms mask, photomask, and reticle are used herein to refer to the same item), or multiple masks. In the present embodiment, the mask 40 is a reflective mask. The mask 40 may incorporate other resolution enhancement techniques such as optical proximity correction (OPC). The mask 40 will be described in further detail later.

The EUV lithography system and process 10 also employs a projection optics box (POB) 50. The POB 50 may have refractive optics or reflective optics. The radiation reflected from the mask 40 (e.g., a patterned radiation) is collected by the POB 50.

The target 60 includes a semiconductor wafer with a photosensitive layer (e.g., photoresist layer or resist), which is sensitive to the EUV radiation. The target 60 may be held by a target substrate stage. The target substrate stage provides control of the target substrate position such that the image of the mask is scanned onto the target substrate in a repetitive fashion (though other lithography methods are possible).

The EUV exposure light source may contain some of out of band radiation (OOB) and a part of the radiation can arrival wafer surface (sometimes referred to as a flare) and causes image contrast loss. Comparing with EUV, the OOB which can arrive wafer surface may have longer wavelength, such as deep ultraviolet (DUV) wavelength. So a stray light level of DUV flare should be much lower than that of EUV. In this situation, the major DUV flare contribution may come from in situ rather than proximity region. In EUV lithography process, it is important to evaluate the DUV flare impacts for better optical simulation, prediction and making a strategy to suppress this impact. Due to DUV flare in EUV scanner may be a local flare rather than stray light caused by non-pure illumination wavelength and impacts of DUV flare may depend on mask structure and pattern density, a method of evaluating this local flare and distinguishing a contribution between EUV and DUV flare is described as below.

The following description refers to the mask 40 and mask fabrication process. The mask fabrication process usually includes two steps: a mask substrate fabrication process and a mask patterning process. A mask substrate is formed by a stack of layers (e.g., multiple reflective layers). The mask substrate is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of more than 50 masks) may be used to construct a complete IC device.

Figure 2:
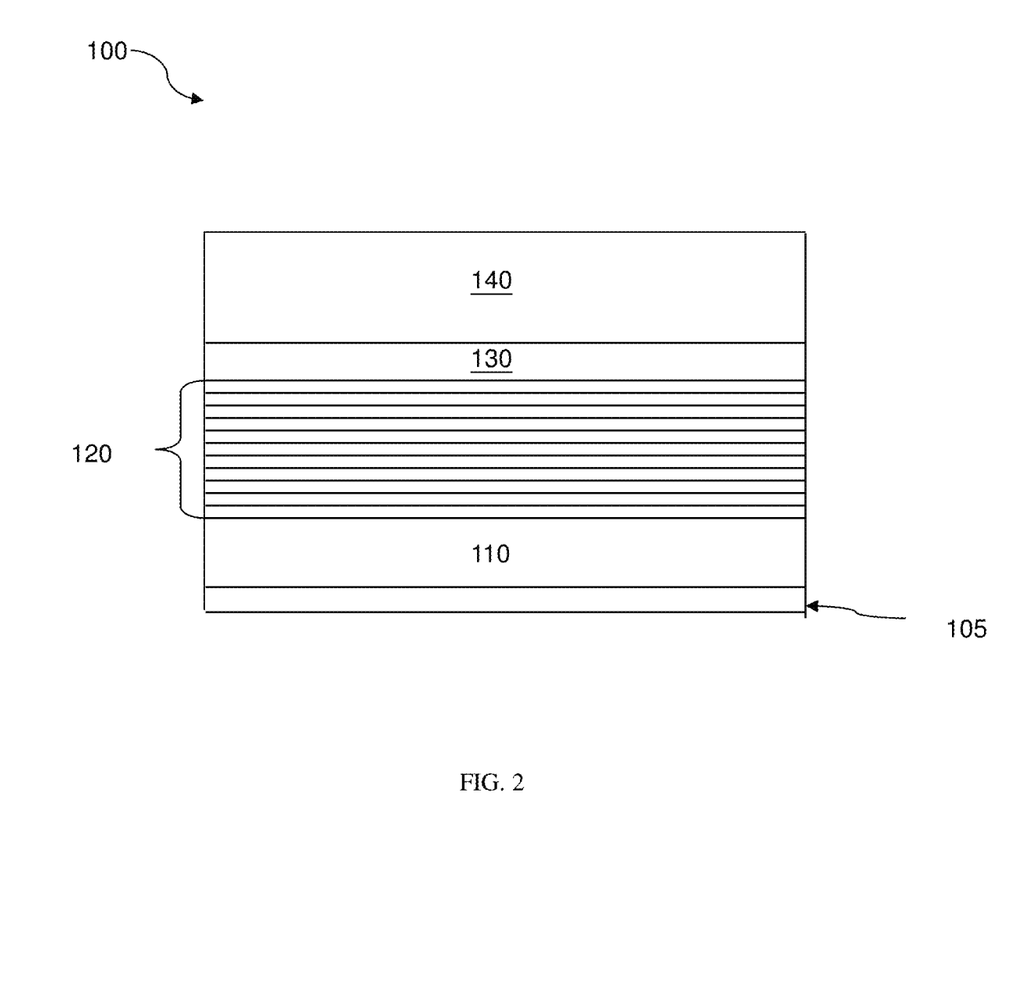
FIG. 2 is a diagrammatic cross-sectional of a blank mask at various stages of a lithography process constructed according to aspects of the present disclosure.

Referring to FIG. 2, a mask substrate 100 includes a material layer 110 made of low thermal expansion material (LTEM). The LTEM material includes $TiO_2$, doped $SiO_2$, and/or other low thermal expansion materials known in the art. The LTEM layer 110 serves to minimize image distortion due to mask heating. In the present embodiment, the LTEM layer 110 includes materials with a low defect level and a smooth surface. In addition, a conductive layer 105 may be deposited under (as shown in the figure) the LTEM layer 110 for electrostatic chucking the mask. In an embodiment, the conductive layer 105 includes chromium nitride (CrN), though other compositions are possible.

The mask substrate 100 also includes a first reflective multilayer (ML) 120 deposited over the LTEM layer 110. According to Fresnel equations, light reflection will occur when light propagates across the interface between two materials of different refractive indices. The reflected light is larger when the difference of refractive indices is larger. To increase the reflected light, one may also increase the number of interfaces by deposing a multilayer of alternating materials and let light reflected from different interfaces interfere constructively by choosing appropriate thickness for each layer inside the multilayer. However, the absorption of the employed materials for the multilayer limits the highest reflectivity that can be achieved. The first reflective ML 120 includes a plurality of film pairs, such as molybdenum-silicon (Mo/Si) film pairs (e.g., a layer of molybdenum above or below a layer of silicon in each film pair). Alternatively, the first reflective ML 120 may include molybdenum-beryllium (Mo/Be) film pairs, or any material pair that is highly reflective at EUV wavelengths can be utilized for the first reflective ML 120. The thickness of each layer of the first reflective ML 120 depends on the EUV wavelength and the incident angle. The thickness of the first reflective ML 120 is adjusted to achieve a maximum constructive interference of the EUV light reflected at each interface and a minimum absorption of the EUV light by the first reflective ML 120. The first reflective ML 120 may be selected such that it provides a high reflectivity to a selected radiation type/wavelength. A typical number of film pairs is 20-80, however any number of film pairs is possible. The first reflective ML 120 usually achieves a reflectance of 0.65 or above. In an embodiment, the first reflective ML 120 includes forty pairs of layers of Mo/Si. Each Mo/Si film pair has a thickness of about 7 nm, with a total thickness of 280 nm. In this case, a reflectivity of about 70% is achieved. In one embodiment, the first ML 120 is configured as forty pairs of films of 3 nm Mo and 4 nm Si.

The mask substrate 100 may also include a capping layer 130 disposed above the first reflective ML 120 to prevent oxidation of the reflective ML. In one embodiment, the capping layer 130 includes ruthenium (Ru), Ru compounds such as RuB, RuSi, chromium (Cr), Cr oxide, and Cr nitride. The capping layer 130 has a thickness of about 2.5 nm.

The mask substrate 100 also includes an absorption layer 140 formed above the capping layer 130. The absorption layer 140 includes multiple film layers with each film containing chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, other suitable materials, or mixture of some of the above. In one embodiment, the absorption layer 140 includes 70 nm tantalum boron nitride (TaBN). In another embodiment, the absorption layer 140 includes 56 nm tantalum boron nitride (TaBN) and 14 nm tantalum boron oxide (TaBO) deposited over the TaBN layer.

One or more of the layers 105, 120, 130 and 140 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art.

Figure 3:
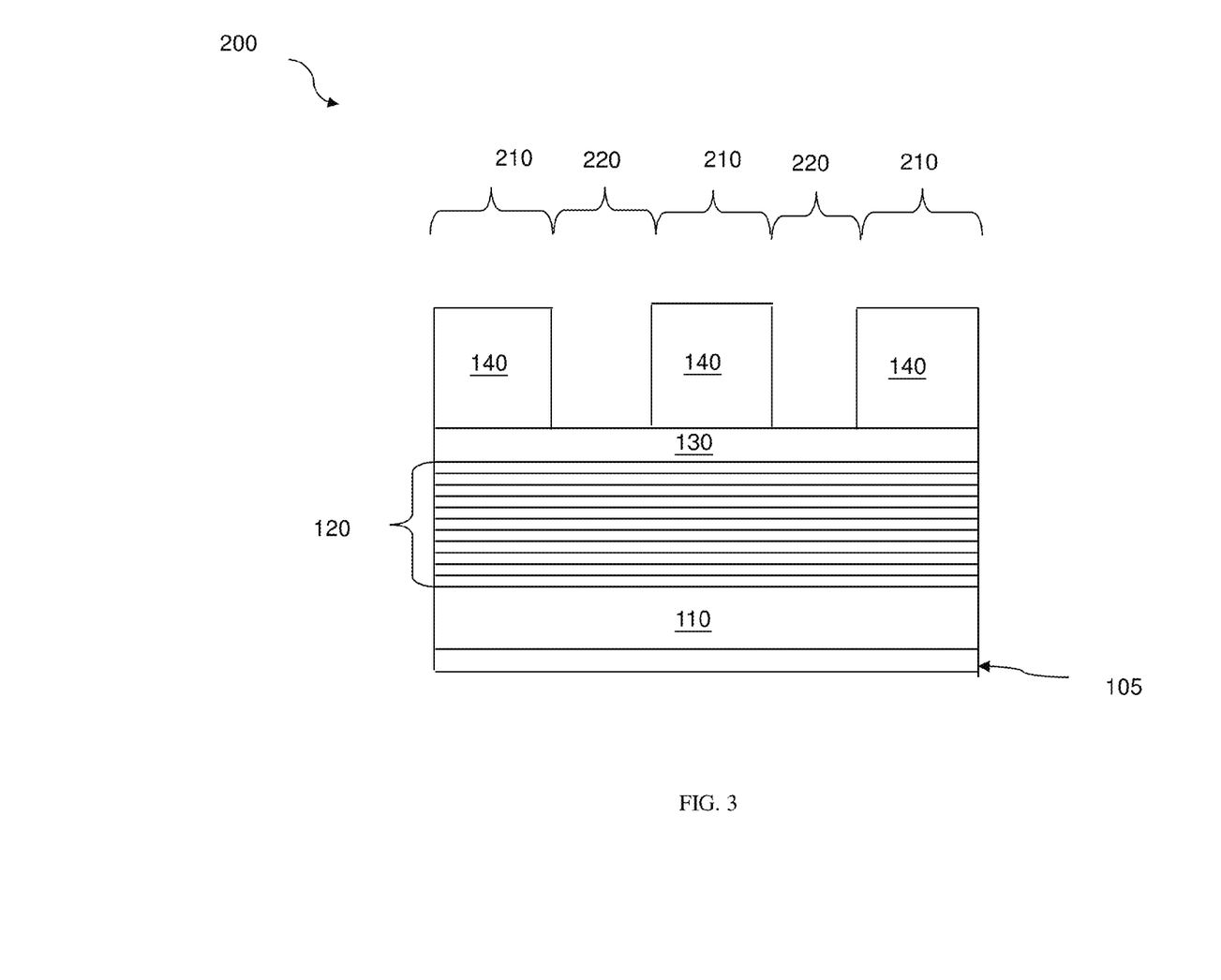
FIG. 3 is a diagrammatic cross-sectional view of various aspects of one embodiment of an EUV mask at various stages of a lithography process constructed according to aspects of the present disclosure.

Referring to FIG. 3, the absorption layer 140 is patterned to form the design layout pattern EUV mask 200 having first and second region, 210 and 220. In the first region 210, the absorption layer 140 remains while in the second region 220, it is removed. The absorption layer 140 can be patterned by various patterning techniques. One such technique includes using a resist coating (e.g., spin-on coating), soft baking, mask aligning, exposure, post-exposure baking, developing the resist, rinsing, and drying (e.g., hard baking). An etching process follows to remove the absorption layer 140 in the second region 220. The etching process may include dry (plasma) etching, wet etching, and/or other etching methods. For example, the dry etching process may implement a fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. Alternative patterning processes include maskless photolithography, electron-beam writing, direct-writing, and/or ion-beam writing.

Figure 4A:
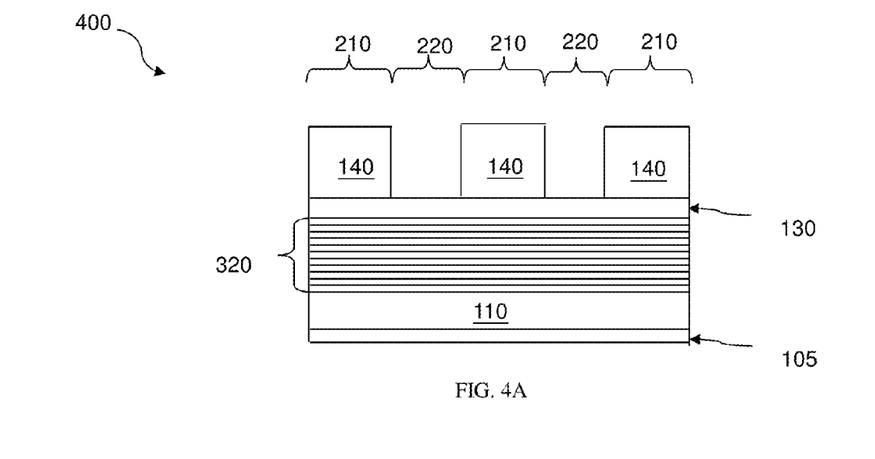
FIGS. 4A and 4B are diagrammatic cross-sectional views of another EUV mask at various stages of a lithography process constructed according to aspects of the present disclosure.

Referring to FIG. 4A, a low EUV reflectivity (LEUVR) mask 400 is formed similarly in many respects to the EUV mask 200 discussed above in FIG. 3, except it has a different ML, a second ML 320. The second ML 320 is configured to have a low EUV reflectivity. For example, the reflectivity of the second ML 320 is less than 2%. In one embodiment, the second ML 320 is configured as forty pairs of films of 1.5 nm Mo and 2 nm Si. In another embodiment, the second ML 320 is configured as 280 nm MoSi. In yet another embodiment, the second ML 320 is configured as forty pairs of films of 4.5 nm Mo and 6 nm Si.

Figure 4B:
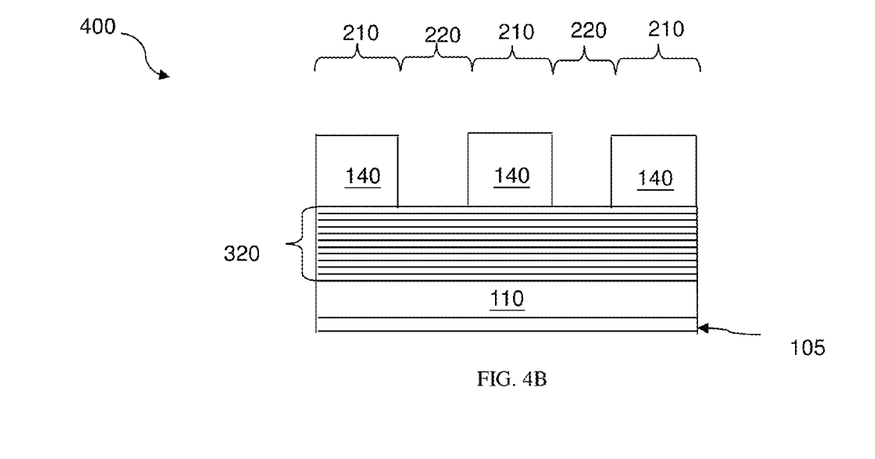

Alternatively, the LEUVR mask 400 is configured to have the second ML 320 of forty film pairs of 1.5 nm Mo and 2 nm Si. In the embodiment of FIG. 4B, the LEUVR mask 400 has no capping layer (such as the layer 130 shown in FIG. 4A).

The EUV masks 200 and the LEUVR mask 400 may also incorporate other resolution enhancement techniques such as an optical proximity correction (OPC). The mask 200 may undergo a defect repair process by a mask defect repair system. The mask defect repair system is a suitable system, such as an e-beam repair system and/or a focused ion beam (FIB) repair system.

Figure 5:
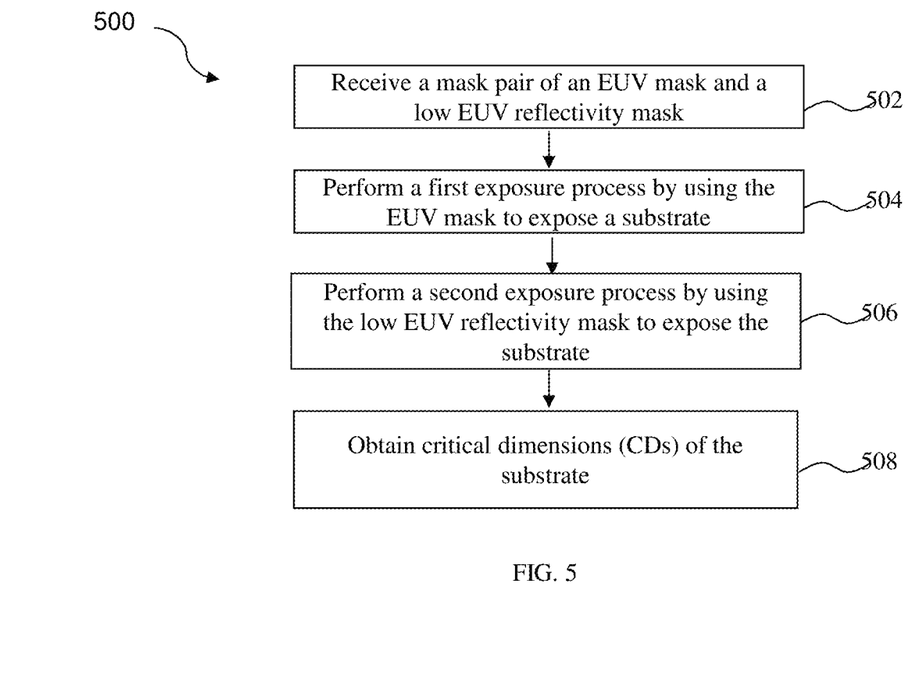
FIG. 5 is a flow chart of an example method for evaluating deep ultraviolet (DUV) flare impact according to various aspects of the present disclosure.
Figure 6A:
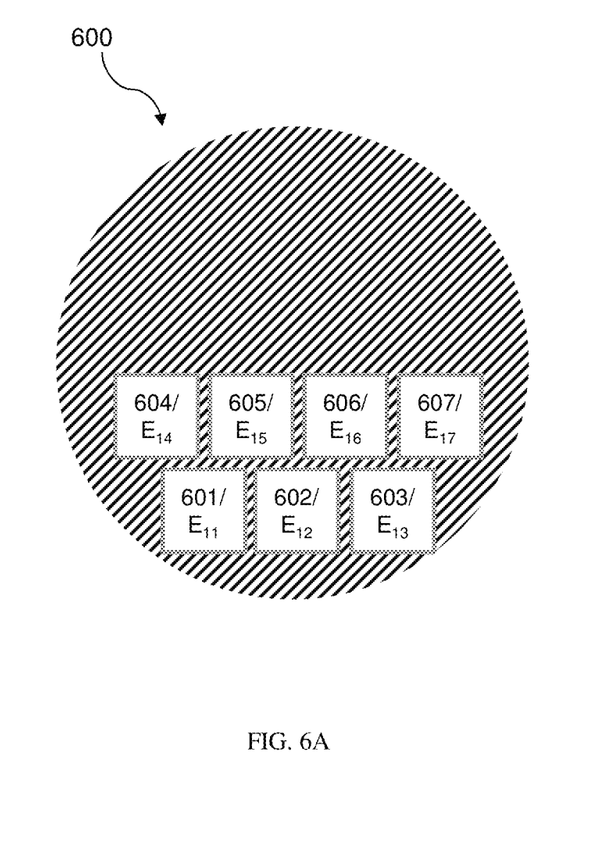
FIGS. 6A and 6B are top schematic views of patterning a substrate using different masks in the method of FIG. 5 according to various aspects of the present disclosure.
Figure 6B:
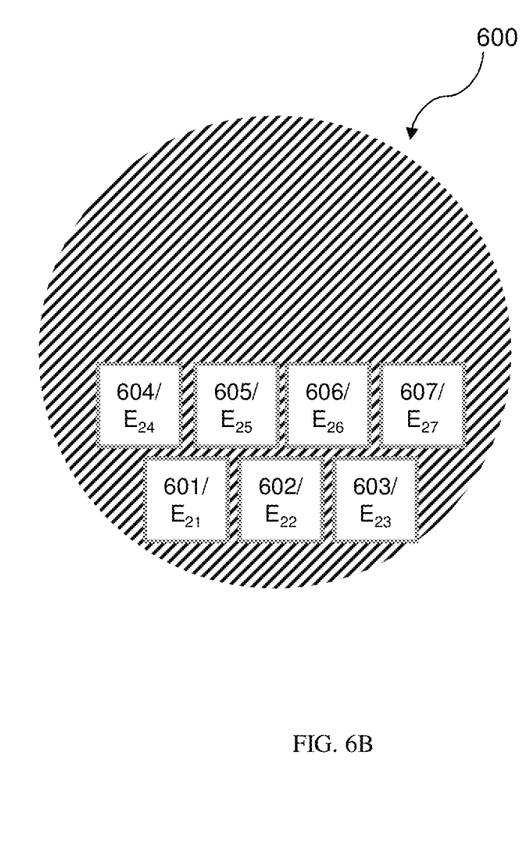

FIG. 5 is a flowchart of a method 500 of evaluating DUV flare impacts constructed according to aspects of the present disclosure. FIGS. 6A and 6B are diagrammatic top views of patterning a target 600 at various stages of the method 500.

The method 500 begins at step 502 by providing the EUV mask 200 having a first EUV reflectivity $r_1$ and the LEUVR mask 400 having a second EUV reflectivity $r_2$. The EUV mask 200 and the LEUVR mask 400 has a same absorber pattern but different ML configuration to produce different EUV reflectivity, as described in FIG. 4A.

Referring FIGS. 5 and 6A, the method 500 proceeds to step 504 by performing a first exposure process using the EUV mask 200 on a substrate 600 by an EUV scanner. In present embodiment, the EUV scanner employs an EUV radiation carrying an OOB radiation. The first exposure process starts at a first region 601 in the substrate 600 coated with a photoresist layer, then a second exposure process is performed to a second region 602, a third exposure process is performed in a third region 603, and so on. In the present embodiment, the first exposure process is conducted according to a first exposure dose matrix. The first exposure dose matrix is configured such that, through the EUV mask 200, using an exposure dose $E_{11}$ to expose the first region 601, using an exposure dose $E_{12}$, which is equal to $E_{11}-\Delta$ to expose the second region 602 (here $\Delta=r_2/r_1\times E_{11}$); using an exposure dose $E_{13}$, which is equal to $E_{11}-2\Delta$ to expose the third region 603; . . . , and using an exposure dose $E_{1N}$, which is equal to $E_{11}-(N-1)\Delta$ to expose the $N^{th}$ region 60N.

In one embodiment, the $E_{11}$ is an optimized exposure dose (Eop) for the EUV mask 200. The Eop may be determined based on an exposure dose for the pattern of the EUV mask 200 to achieve a pre-specified target dimension on the substrate 600 under a corresponding single exposure process. The Eop may vary according to pattern density of the EUV mask 200. Thus $E_{12}$ is equal to Eop$-\Delta$, $E_{13}$ is equal to Eop$-2\Delta$ . . . $E_{1N}$ is equal to Eop$-(N-1)\Delta$.

With the first EUV reflectivity $r_1$ of the EUV mask 200, an exposure dose $E_{1N}$ received by the region 60N of the substrate 600 is about $r_1\times E_{11}-r_2(N-1)E_{11}$. When the exposure dose has both of EUV dose and OOB flare does, the $E_{1N}$ is about $r_1\times E_{11EUV}-r_2(N-1)E_{11EUV}$ plus $E_{11OOB}-(N-1)(r_2/r_1)E_{11OOB}$, here $E_{11EUV}$ represents an EUV dose portion of $E_{11}$ and $E_{11OOB}$ represents an OOB flare dose portion of $E_{11}$. In present embodiment, considering the OOB flare dose $E_{11DUV}$ is substantial smaller than the EUV dose $E_{11EUV}$ in the EUV scanner and $r_2$ is substantial smaller than $r_1$, it may be a fair estimation that the exposure dose $E_{1N}$ received by the region 60N receives is close to $r_1\times E_{11EUV}-r_2(N-1)E_{11EUV}$ plus $E_{11OOB}$. As an example, when the exposure dose has EUV dose and DUV flare does, the region 601 may receive the exposure dose as $r_1\times E_{11EUV}$ plus $E_{11DUV}$; the region 602 may receive exposure dose as $r_1\times E_{11EUV}-r_2\times E_{11EUV}$ plus $E_{11DUV}$; the region 603 may receive exposure dose as $E_{11EUV}-2r_2\times E_{11EUV}$ plus $E_{11DUV}$; . . . , the region 60N may receive exposure dose as $r_1\times E_{11EUV}-r_2(N-1)E_{11EUV}$ and $E_{11DUV}$.

Referring FIGS. 5 and 6B, the method 500 proceeds to step 506 by performing second exposure using the LEUVR mask 400 on the substrate 600 by the same EUV scanner having the same radiation. In the present embodiment, the second exposure process is conducted according to a second exposure dose matrix. The second exposure dose matrix is configured such that, through the LEUVR mask 400, using zero exposure dose to expose the first region 601, using an exposure dose $E_{22}$, which is equal to $E_{11}$ to expose the second region 602; using an exposure dose $E_{23}$, which is equal to $2E_{11}$ to expose the third region 603 . . . , and using an exposure dose $E_{2N}$, which is equal to $(N-1)E_{11}$ to expose the $N^{th}$ region 60N.

With the second EUV reflectivity $r_2$ of the LEUVR mask 400, the exposure dose received by the $N^{th}$ region 60N is close to $r_2\times(N-1)E_{11EUV}$ and $(N-1)E_{11OOB}$. As an example, the region 601 receives zero dose; the region 602 receives exposure dose as $r_2\times E_{11EUV}$ and $E_{11DUV}$; the region 603 may receive exposure dose as $2r_2\times E_{11EUV}$ and $2E_{11DUV}$; . . . , the region 60N may receive exposure dose as $r_2(N-1)E_{11EUV}$ and $(N-1)E_{11DUV}$. In present embodiment, considering $r_2$ is substantial small, it may be a fair estimation that exposure does received by the region 60N is close to $r_2(N-1)E_{11EUV}$ plus $(N-1)E_{11OOB}$.

Thus after the first and second exposure processes, a total exposed dose $E_T$ received by each region of the substrate 600 is close to a sum of EUV dose and OOB flare dose received in these two exposures through the two masks, respectively. Considering the OOB flare dose is substantial smaller than the EUV dose in the EUV scanner and $r_2$ is substantial smaller than $r_1$, it may be a fair estimation that $E_{T1}$ received by the region 601 is close to $r_1\times E_{11EUV}+E_{11OOB}$; $E_{T2}$ received by region 602 is close to $r_1\times E11_{EUV}+2E_{11OOB}$; $E_{T3}$ received by the region 603 is close to $r_1\times E_{11EUV}+3E_{11OOB}$; . . . ; $E_{TN}$ received by the region 60N is close to $r_1\times E_{11EUV}+N\times E_{11OOB}$. For example, when the exposure dose has EUV dose and DUV flare does, $E_{TN}$ received by the region 60N is close to $r_1\times E_{11EUV}+N\times E_{11DUV}$. In another word, each region in the substrate 600 receives a substantial same EUV exposure dose, $r_1\times E_{11EUV}$, and a different OOB flare dose, $N\times E_{11OOB}$.

Referring to FIG. 5, the method 500 proceeds to step 508 by obtaining critical dimension (CD) data for each region of the substrate 600. After performing the first and the second exposure process, a developing process is performed on the photoresist layer of the substrate 600. During the developing process, a developing solution is applied to the photoresist layer. In an example, the developing solution is a basic solution, such as tetramethylammonium hydroxide (TMAH). The developing solution removes exposed or unexposed portions of the photoresist layer depending on the resist material. For example, the photoresist layer includes positive-tone resist material, so the developing process removes (dissolves) the exposed portions of the photoresist layer and leave the unexposed portions of the photoresist layer over the substrate 600. Alternatively, where the photoresist layer includes negative-tone resist material, the developing process removes (dissolves) the unexposed portions of the photoresist layer and leave the exposed portions of the photoresist layer over the substrate 600. A rinsing process, such as a de-ionized (DI) water rinse. The rinsing process may remove residue particles.

Figure 7:
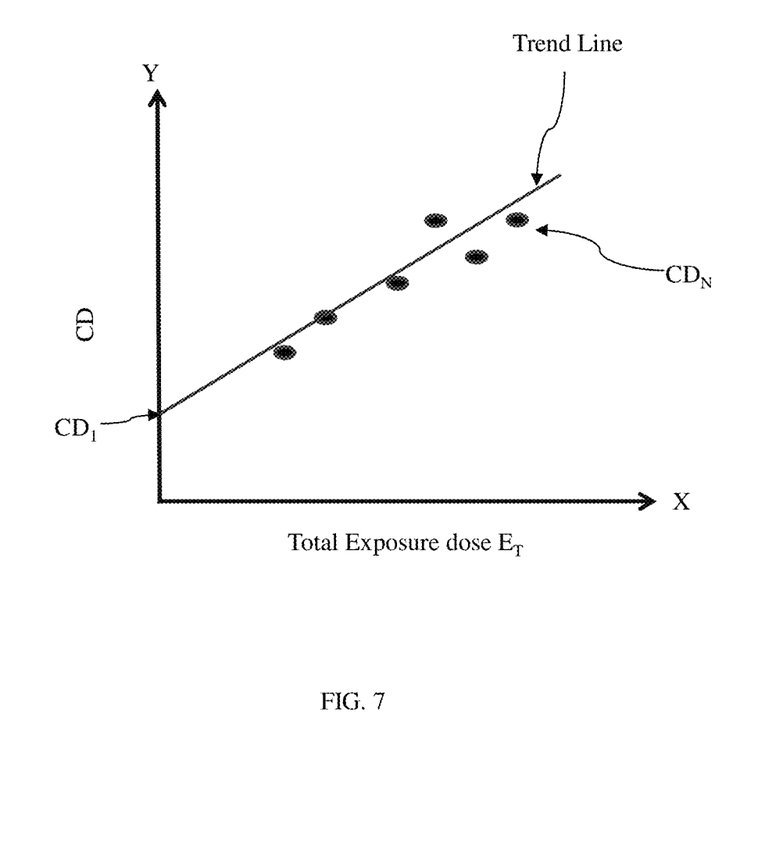
FIG. 7 is a chart of critical dimension (CD) vs. DUV flare according to various aspects of the present disclosure.

A CD measurement is performed to obtain $CD_1$ of the first region 601, $CD_2$ of the second region 602, $CD_3$ of the second region 603, ... $CD_N$ of the second region 60N. A relationship between each $CD_N$ and a corresponding total exposure dose $E_T$ may be studied by any suitable method to evaluate DUV flare impacts, produced by the EUV scanner, on the EUV mask 200 (with its mask structure and pattern density). As an example, a plot of CD vs. total exposure dose $E_T$ is formed with total exposure dose $E_T$ as its X-axis and CD as its Y-axis. A trend line of CD vs. total exposure dose $E_T$ may be obtained as well from the plot. Since the EUV exposure dose received by each region in the substrate 600 is substantially same and variations of the total exposure dose $E_T$ represent mainly variations of DUV flare, the difference between Y-axis intercept and $CD_1$ is proportional to DUV level, as shown in FIG. 7.

Additional steps can be provided before, during, and after the method 500, and some of the steps described can be replaced, eliminated, or moved around for additional embodiments of the method 500.

Based on the above, the present disclosure offers the EUV lithography process to evaluate DUV flare impact on an EUV mask exposed by an EUV scanner. The process employs a mask pair having same pattern but different EUV reflectivity. The process also employs two exposure dose matrixes for multiple exposure processes using the mask pair to reveal DUV flare impact on the EUV mask by the EUV scanner.

The present disclosure is directed towards lithography systems and processes. In one embodiment, an extreme ultraviolet lithography (EUVL) process includes receiving a mask pair having a same pattern. The mask pair includes an extreme ultraviolet (EUV) mask having a first EUV reflectivity $r_1$ and a low EUV reflectivity mask having a second EUV reflectivity $r_2$. The process also includes receiving a substrate coated with a photoresist layer, receiving an EUV scanner equipped with an EUV radiation. The process also includes performing a first exposure process to the substrate, by using the EUV scanner and the EUV mask. The first exposure process is conducted according to a first exposure dose matrix. The process also includes performing a second exposure process to the substrate, by using the EUV scanner and the low EUV reflectivity mask. The second exposure process is conducted according to a second exposure dose matrix.

The present disclosure is also directed towards masks. In one embodiment, a low EUV reflectivity mask includes a low thermal expansion material (LTEM) layer, a reflective multilayer (ML) having less than 2% EUV reflectivity, which is deposited over the LTEM layer, a capping layer over the ML and a patterned absorption layer over the capping layer.

In another embodiment, an extreme ultraviolet lithography (EUVL) process to evaluate deep ultraviolet (DUV) flare impacts includes receiving a mask pair having a same pattern. The mask pair includes an extreme ultraviolet (EUV) mask having a first EUV reflectivity $r_1$ and a low EUV reflectivity mask having a second EUV reflectivity $r_2$. The process also includes performing a first exposure process using the EUV mask by an EUV scanner equipped with a EUV radiation to expose a substrate. Exposure doses of the first exposure process are conducted according to a first exposure dose matrix. The first exposure dose matrix includes using an optimized exposure dose (Eop) of the EUV mask to a first region of the substrate, using an exposure dose of Eop−Δ to expose a second region of the substrate. Here $Δ=r_2/r_1 \times Eop$, using an exposure dose of Eop−2Δ to expose a third region of the substrate, ..., and using an exposure dose of Eop−(N−1)Δ to expose a N region of the substrate. The process also includes performing a second exposure process using the low EUV reflectivity mask by the EUV scanner having the EUV radiation to expose the substrate. The exposure doses of the second exposure process are conducted according to a second exposure dose matrix. The second exposure dose matrix includes using a zero exposure dose on the first region of the substrate, using an exposure dose of Eop to expose the second region of the substrate, using an exposure dose of 2Eop to expose the third region of the substrate, ..., and using an exposure dose of (N−1) Eop to expose the N region of the substrate. The process also includes performing a developing process on the substrate and measuring critical dimensions (CDs) of the substrate.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet lithography (EUVL) process comprising:
   receiving a mask pair having at least one common pattern, the mask pair including:
      an extreme ultraviolet (EUV) mask having a first EUV reflectivity $r_1$; and
      a low EUV reflectivity mask having a second EUV reflectivity $r_2$;
   receiving a substrate coated with a photoresist layer;
   receiving an EUV scanner equipped with an EUV radiation;
   performing a first exposure process to the substrate, by using the EUV scanner and the EUV mask, wherein the first exposure process is conducted according to a first exposure dose matrix; and
   performing a second exposure process to the substrate, by using the EUV scanner and the low EUV reflectivity mask, wherein the second exposure process is conducted according to a second exposure dose matrix.

2. The process of claim 1, wherein the first exposure dose matrix is performed as:
   exposing N regions of the substrate, each region ("n", ranging from 1 to N) receives a different exposure dose according to the formula:

$$Eop-(n-1)Δ,$$

where $Δ=r_2/r_1 \times Eop$ and Eop=an optimized exposure dose.

3. The process of claim 1, wherein the second exposure dose matrix is performed as:
   exposing N regions of the substrate, each region ("n", ranging from 1 to N) receives a different exposure dose according to the formula: (n−1)Eop, where Eop is an optimized exposure dose.

4. The process of claim 1, wherein each region of the substrate receives a total exposure dose, which is a combination of the exposure doses received in the first and second exposure processes.

5. The process of claim 4, wherein each region of the substrate receives a substantial same amount of exposure dose from the EUV radiation.

6. The process of claim 4, wherein each region of the substrate receives a substantial different exposure dose from a deep ultraviolet (DUV) out of band (OOB) radiation of the EUV radiation.

7. The process of claim 1, further comprising:
measuring critical dimensions (CDs) of each region of the substrate; and
plotting a chart of CDs vs. a sum of exposure doses of the first and second exposures to identify a trend line of CD vs. a DUV OOB radiation levels.

8. The process of claim 7, further comprising:
using the chart, determining a DUV flare impact on the EUV mask exposed by the EUV scanner.

9. The process of claim 1, wherein the EUV reflectivity of the low EUV reflectivity mask is configured to be less than 2%.

10. The process of claim 1, wherein the EUV reflectivity of the EUV mask is configured to be more than 60%.

11. An extreme ultraviolet lithography (EUVL) process, comprising:
receiving a mask pair having a common pattern, the mask pair including:
an extreme ultraviolet (EUV) mask having a first EUV reflectivity $r_1$; and
a low EUV reflectivity mask having a second EUV reflectivity $r_2$;
performing a first exposure process using the EUV mask by an EUV scanner equipped with a EUV radiation to expose a substrate, wherein exposure doses of the first exposure process are conducted according to a first exposure dose matrix, the first exposure dose matrix configured for:
exposing a first region of the substrate with an optimized exposure dose (Eop) of the EUV mask;
exposing a second region of the substrate with an exposure dose of Eop−Δ, where $\Delta = r_2/r_1 \times Eop$;
exposing a third region of the substrate with an exposure dose of Eop−2Δ; and
continuing with a similar pattern through each additional region of the substrate;
performing a second exposure process using the low EUV reflectivity mask by the EUV scanner having the EUV radiation to expose the substrate, wherein exposure doses of the second exposure process is conducted according to a second exposure dose matrix, the second exposure dose matrix configured for:
exposing the first region of the substrate with a zero exposure dose;
exposing the second region of the substrate with an exposure dose of Eop;
exposing the third region of the substrate with an exposure dose of 2Eop; and
continuing with a similar pattern through each additional region of the substrate;
performing a developing process on the substrate; and
measuring critical dimensions (CDs) of the substrate.

12. The process of claim 11, further comprising:
plotting CDs vs. a total exposure dose chart, wherein the total exposure dose is a sum of doses received in the first and second exposure processes by the substrate; and
obtaining a trend line of CD vs. total exposure doses from the chart.

13. The process of claim 11, further comprising:
measuring critical dimensions (CDs) of each region of the substrate; and
plotting a chart of CDs vs. total exposure dose to identify a trend line of CD vs. DUV OOB radiation levels.

14. The process of claim 11, wherein the EUV reflectivity of the EUV mask is configured to be more than 60%.

15. The process of claim 13, further comprising: using the chart, determining DUV flare impact on the EUV mask exposed by the EUV scanner.

16. An extreme ultraviolet lithography (EUVL) process, comprising:
receiving a mask pair having at least one common pattern, the mask pair including:
an extreme ultraviolet (EUV) mask having a first EUV reflectivity $r_1$; and
a low EUV reflectivity (LEUVR) mask having a second EUV reflectivity $r_2$ that is substantially smaller than $r_1$;
receiving a substrate coated with a photoresist layer;
performing a first exposure process to a plurality of regions of the photoresist layer using the EUV mask, wherein the first exposure process is conducted according to a first exposure dose matrix; and
performing a second exposure process to the plurality of regions of the photoresist layer using the LEUVR mask, wherein the second exposure process is conducted according to a second exposure dose matrix.

17. The process of claim 16, wherein the first exposure dose matrix is performed as:
each region n (n ranging from 1 to N) of the plurality of regions receives an exposure dose equal to (Eop−(n−1)Δ), where $\Delta = r_2/r_1 \times Eop$ and Eop=an optimized exposure dose.

18. The process of claim 16, wherein the second exposure dose matrix is performed as:
each region n (n ranging from 1 to N) of the plurality of regions receives an exposure dose according to the formula: (n−1)Eop, where Eop is an optimized exposure dose.

19. The process of claim 16, further comprising:
developing the exposed photoresist layer.

20. The process of claim 19, further comprising:
after the developing of the exposed photoresist layer, measuring critical dimensions (CDs) of each of the plurality of regions; and
plotting a chart of CDs vs. a sum of exposure doses of the first and second exposures received by each of the plurality of regions.

* * * * *